United States Patent

Ravi et al.

[11] Patent Number: 6,112,063
[45] Date of Patent: *Aug. 29, 2000

[54] AUTOMATIC RADIO STATION MEMORY PROGRAMMING

[75] Inventors: Latha Ravi, Farmington Hills; Douglas Scott Arrowsmith, Milford; Peter Llewellyn, Southfield, all of Mich.

[73] Assignee: Thomson Consumer Electronics Sales, GmbH, Hannover, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/918,449

[22] Filed: Aug. 26, 1997

[51] Int. Cl.[7] ...................................................... H04B 1/18
[52] U.S. Cl. ............................................ 455/186.1; 455/45
[58] Field of Search ................................... 455/45, 161.1, 455/161.2, 161.3, 179.1, 184.1, 185.1, 186.1, 186.2

[56] References Cited

U.S. PATENT DOCUMENTS

| | | | |
|---|---|---|---|
| 4,236,251 | 11/1980 | Ohgishi et al. | 455/180 |
| 4,298,851 | 11/1981 | Shichijo et al. | 334/11 |
| 4,392,247 | 7/1983 | van Deursen | 455/161 |
| 4,509,203 | 4/1985 | Yamada | 455/166 |
| 4,561,112 | 12/1985 | Ridder | 455/166 |
| 4,833,728 | 5/1989 | Kimura et al. | 455/166 |
| 4,881,273 | 11/1989 | Koyama et al. | 455/161 |
| 4,969,209 | 11/1990 | Schwob | 455/158 |
| 5,048,119 | 9/1991 | Wassink | 455/161 |
| 5,152,011 | 9/1992 | Schwob | 455/158.5 |
| 5,152,012 | 9/1992 | Schwob | 455/158.5 |
| 5,161,253 | 11/1992 | Hirano | 455/161.3 |
| 5,212,818 | 5/1993 | Fukami | 455/186.1 |
| 5,345,607 | 9/1994 | Liman et al. | 455/186.1 |
| 5,357,285 | 10/1994 | Sanya et al. | 348/716 |
| 5,475,874 | 12/1995 | Klos | 455161/161.2 |
| 5,732,338 | 3/1998 | Schwob | 455/158.5 |
| 5,802,066 | 9/1998 | Miyake et al. | 455/186.1 |

FOREIGN PATENT DOCUMENTS

| | | | |
|---|---|---|---|
| 0462718A2 | 12/1991 | European Pat. Off. | H03J 7/18 |
| 0680166A1 | 11/1995 | European Pat. Off. | H04H 1/00 |
| 0684711A1 | 11/1995 | European Pat. Off. | H04H 1/00 |

*Primary Examiner*—Nguyen Vo
*Attorney, Agent, or Firm*—Joseph S. Tripoli; Robert D. Shedd

[57] ABSTRACT

An autoset or auto-store function for a radio receiver selects stations for storing in association with respective presets according to the stored station format of the normal presets which have been manually set by the radio user for their home area. When activating the autoset feature when traveling out-of-town, the invention ensures consistent station formats at the presets according to the scheme adopted by the user. For any presets that have no station content code stored for them or for which no matching broadcast can be found during the autoset scan, a fill is conducted to associate listenable broadcasts with these remaining presets.

3 Claims, 4 Drawing Sheets

AUTOMATIC RADIO STATION MEMORY PROGRAMMING

BACKGROUND OF THE INVENTION

The present invention relates in general to the automatic programming of memory preset buttons in a radio receiver, and more specifically to a radio data system (RDS) receiver in which automatic memory programming is done according to a content or format type code of a broadcast station previously associated with each preset button.

Automotive radio receivers typically include preset buttons, usually labeled with numerals 1 through 6, which may be manually set to link to a desired broadcast station. Thus, a user can quickly and easily retune the radio receiver to a favorite station by pressing the preset button.

When a vehicle is driven away from its usual listening area, the manual settings of the preset buttons can become invalid since the intended station may be out of range. An autoset or auto-store function is known which searches for stations with a field strength over a threshold and then stores a station for each preset button either in order of increasing field strength or increasing frequency. While listenable stations may thus be linked to the preset buttons after activating the autoset function while traveling, the user has no way of knowing what kind of station will be stored at any preset.

Radio data systems such as the RDS system in Europe and the radio broadcast data system (RBDS) in the United States transmit auxiliary information with the radio broadcast including a program type code or a program identification code that identifies a content type by which a respective broadcast station is operating (e.g., classical, rock, jazz, news, or even specific network programming). The content type is used by the present invention to assign broadcast stations to preset buttons during an autoset operation in a manner to be consistent with the station formats the user is normally accustomed to find at each preset.

SUMMARY OF THE INVENTION

The present invention provides the advantage that memory preset buttons may be programmed during an autoset function outside of a vehicle's usual listening area in such a way that the same particular types of stations may be found at the preset buttons as in the home area. Thus, if the preset buttons have been manually set in the home area with preset 1 linking to a rock format station, preset 2 linking to a jazz station, etc., presets 1 and 2 will continue to link to a rock and a jazz station, respectively, after activating an autoset operation while traveling (as long as listenable stations with the same auxiliary data can be received in the out-of-town area).

These and other important advantageous are achieved by a broadcast radio receiver for receiving broadcasts including auxiliary data, wherein the auxiliary data includes a content code identifying which one of the plurality of predetermined content types a respective broadcast station is operating under. Preset buttons on the receiver retune the receiver to a respective broadcast station associated with each respective preset. The preset buttons selectively operate in either a normal preset mode or in an autoset mode. Each preset button has a normal link with a respective broadcast station in the normal preset mode which is manually determined by a user. Each preset button has an autoset link with a respective broadcast station in the autoset mode which is automatically assigned by the receiver during an autoset scan. A normal preset memory stores a respective frequency value and a respective content code for a broadcast station linked with each respective preset button in the normal preset mode. An autoset memory stores a respective frequency value for a broadcast station linked with a respective preset button in the autoset mode. A broadcast station that is linked in the autoset mode with at least one respective preset button is determined according to a content code of a broadcast station linked with the same preset button in the normal preset mode.

BRIEF DESCRIPTION OF THE DRAWINGS

FIG. 6 is a flowchart showing a method for maintaining a station type code up-to-date during receiver operation.

DETAILED DESCRIPTION OF PREFERRED EMBODIMENTS

Figure 1:
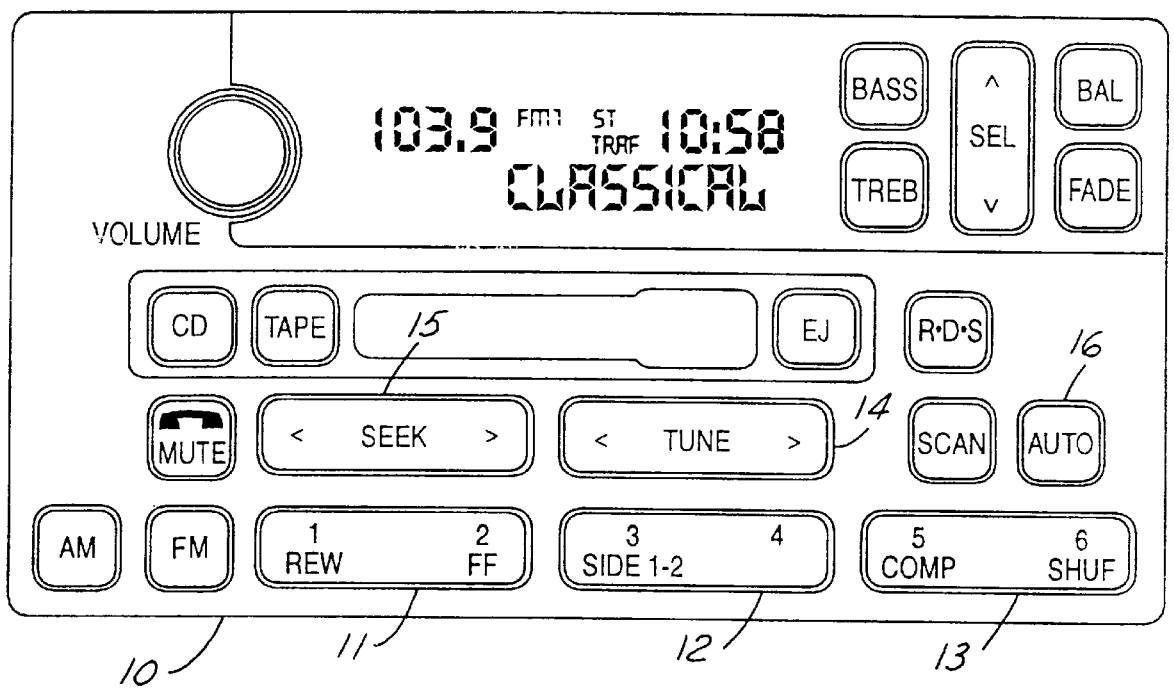
FIG. 1 is a plan view showing a control panel of an automotive audio system as is used in the present invention.

FIG. 1 shows a radio control panel 10 including toggle switches 11, 12, and 13 for selecting radio presets 1–6. To manually store a preset station, the user tunes a desired broadcast station using tune up/down toggle 14 and/or seek up/down toggle 15. The user holds down a preset button for which he or she wishes to store the currently tuned broadcast station for a certain time (e.g., 2 seconds) so that the operating frequency of the broadcast station is transferred into memory to be later recalled by depressing the same preset button. For example, preset button 1 is activated by pressing the left side of toggle switch 11. Once a broadcast station has been stored for a particular preset button, the station can be recalled by quickly pressing and releasing the preset button (e.g., for less than 2 seconds).

In addition to storing frequency information, the present invention also stores content or format code information during a manual preset operation as will be described below. This information is used during an autoset operation which is initiated by pressing the AUTO button 16. The radio receiver operates in a normal mode when normal presets can be manually stored and recalled. Once AUTO button 16 is pressed, the receiver operates in an autoset mode wherein preset button assignments are determined automatically and subsequent manual pressings of preset buttons (e.g., of less than 2 seconds) recall the automatically determined autoset stations. The receiver reverts to the normal mode after a second press of AUTO button 16.

Figure 2:
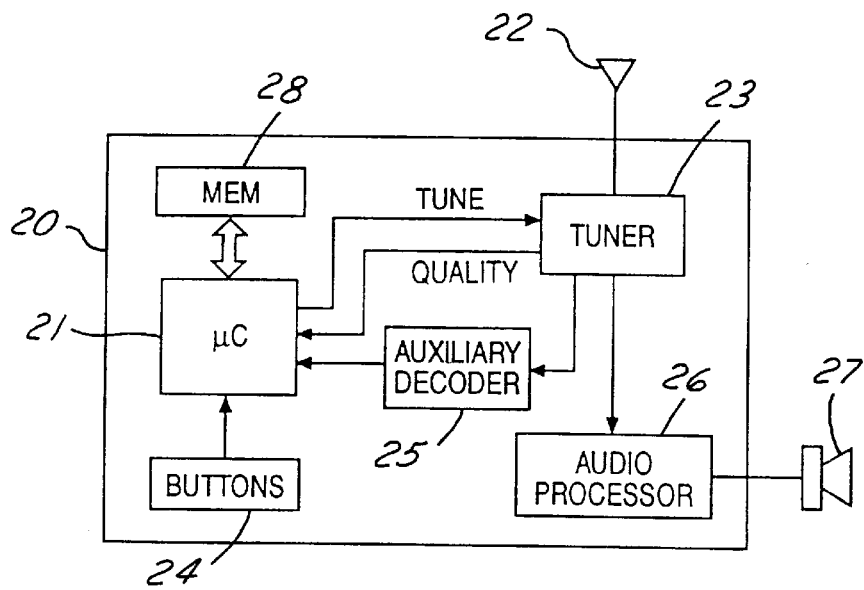
FIG. 2 is a block diagram showing an RDS receiver as used in the present invention.

As shown in FIG. 2, an RDS or RBDS radio receiver 20 operates under control of a microcontroller 21. Radio broadcast signals are picked up by an antenna 22 and relayed to a tuner 23 which is controlled by microcontroller 21. A Tune signal from microcontroller 21 commands the frequency to which tuner 23 is tuned to. A user can control this frequency through radio buttons 24. If a received radio broadcast signal is an RDS or RBDS signal including auxiliary data, then the auxiliary data is removed from the received signal by an auxiliary decoder 25 connected between tuner 23 and microcontroller 21. Tuner 23 provides a Quality signal to microcontroller 21 which identifies the signal strength or other quality measure of a broadcast signal being received. Audio signals from tuner 23 are processed through an audio processor 26 before being reproduced by a speaker 27. Microcontroller 21 is also connected to a memory 28 for storing the links for each preset button.

The autoset function of the present invention operates on the basis of assigning a broadcast station to each respective preset button which has a matching content type to the content type of any broadcast station which had been manually linked with the same preset button. Content type as used herein refers to the subject matter format used by a broadcast station or even the identity of a program being broadcast. Thus, a content type as used in the present invention could be either a program type (PTY) category or a program identification (PI) code as defined in the standards for RDS and RBDS. For example, PTY codes 1–10 for RBDS are assigned to news, information, sports, talk, rock, classic rock, adult hits, soft rock, top 40 and country. A total of 32 codes have been provided for. By using the autoset function as described by the present invention, a user may access stations of the same formats as they are accustomed to accessing in their home area by pressing the same corresponding preset numbers (as long as the out-of-town area has listenable RDS or RBDS stations of the same formats).

Figure 3:
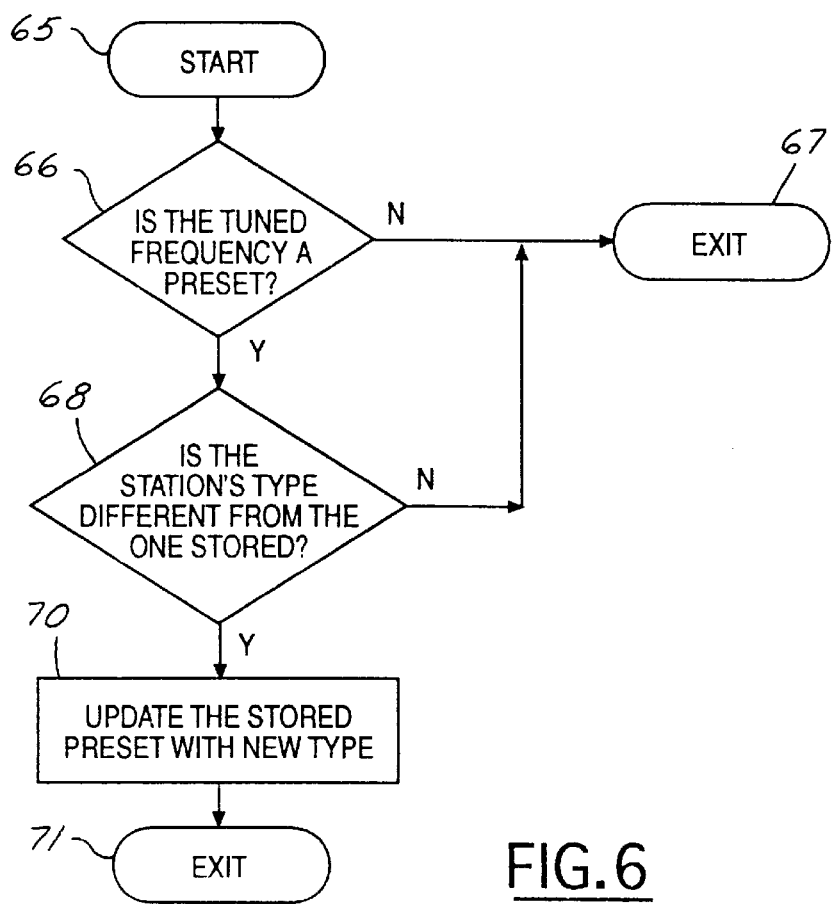
FIG. 3 is a memory map showing memory contents associated with the preset buttons.

The structure of memory 28 is shown in greater detail in FIG. 3. Each preset number has corresponding memory locations for storing frequencies for normal links during the normal preset mode which are manually set by the user; content type information for the normal links; frequency information for an autoset broadcast station which has been found by the procedure to be discussed below; and, finally, quality information corresponding to the broadcast station stored at each autoset link.

Figure 4:
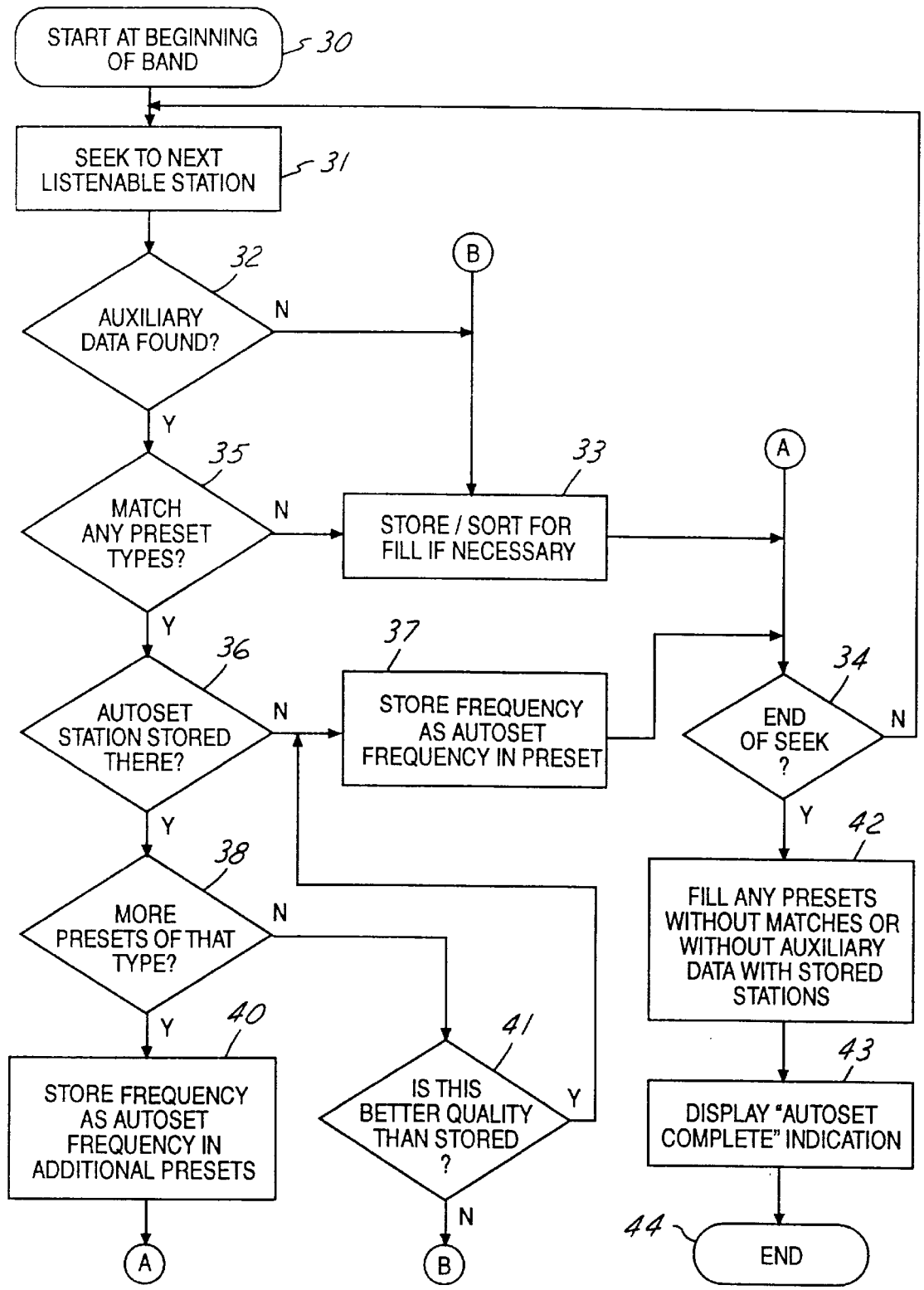
FIG. 4 is a flowchart showing a preferred embodiment of the method by which the present invention operates.

A preferred method for assigning autoset frequencies to respective preset buttons is shown in FIG. 4. It is assumed that memory presets have already been set manually. If no normal links are stored which contain any content type codes, then the procedure is bypassed and the autoset links can be assigned in a conventional manner.

When the AUTO button is pressed on the radio control panel, the autoset function begins in step 30 with the tuner being commanded to tune to the beginning of the band (i.e., AM/FM1/FM2). In step 31, a station seek operation is performed to reach the next listenable broadcast station as determined by the Quality signal from the tuner. When a listenable station has been reached, a check is made in step 32 to determine whether auxiliary data is found (i.e., whether a RDS or RBDS station has been found). If the auxiliary data is not found, then a store/sort of the listenable, non-auxiliary data station is performed in step 33 in order to provide stations to fill presets later in the procedure if any presets are not filled with matching content types. Then in step 34, a check is made to determine whether the end of band has been reached by the seek operation. If the end of band has not been reached, then a return is made to step 31 to seek for the next listenable station.

If auxiliary data is found in step 32, then a check is made in step 35 to determine whether the content code of the received broadcast signal matches the content code of any normal preset station stored in the memory of the receiver. If no match is found then the station is stored and or sorted in step 33. If a match is found to an existing normal-preset content type, then a check is made in step 36 to determine whether an autoset station has already been stored for that matching preset during the current autoset operation. If no station had already been stored, then the frequency of the current broadcast station is stored in step 37 as the autoset frequency for that preset. Then a check is made in step 34 to determine whether an end of band has been reached for this seek operation.

In a preferred embodiment, if there are more than one preset having the same content type code, then the broadcast station is propagated through to each of the presets for this autoset operation so that all presets of that content type will link to a currently receivable station of the correct content type code. When in step 36, if an autoset station has already been stored for a newly found broadcast station with matching auxiliary data, then a check is made in step 38 to determine whether there are more presets of that type code which have not already been set with a different frequency. If such presets are found then the newly tuned frequency is stored as the autoset frequency in these additional presets in step 40. Then a check is made in step 34 to determine whether the end of band has been reached. If no more presets of the current content code are found in step 38, then a comparison of reception quality is performed in step 41. If the quality of the currently tuned station is better than what has been stored for a particular preset, then this fact is identified in step 41 and the currently tuned frequency is now set as the autoset frequency for the preset in step 37 (the stations for that content code may be sorted according to quality so that the worst station is discarded). If the quality is found not to be better than the stored quality in step 41, then the currently tuned broadcast station is stored and/or sorted in step 34 for later filling if necessary.

When the end of band has been reached for the current seek in step 34, then step 42 conducts a fill of any presets that have not been assigned an autoset frequency using the list from step 33 of broadcast stations either without auxiliary data or which have a content type code which does not match the content type codes of the manually set normal presets. In this manner, there is a maximum likelihood of at least some presets having listenable stations assigned to them. In step 43, an "autoset completed" indication is displayed on the radio control panel and the autoset procedure ends in step 44. The display continues to carry an indication that the autoset mode is active until the AUTO button is pressed again.

Figure 5:
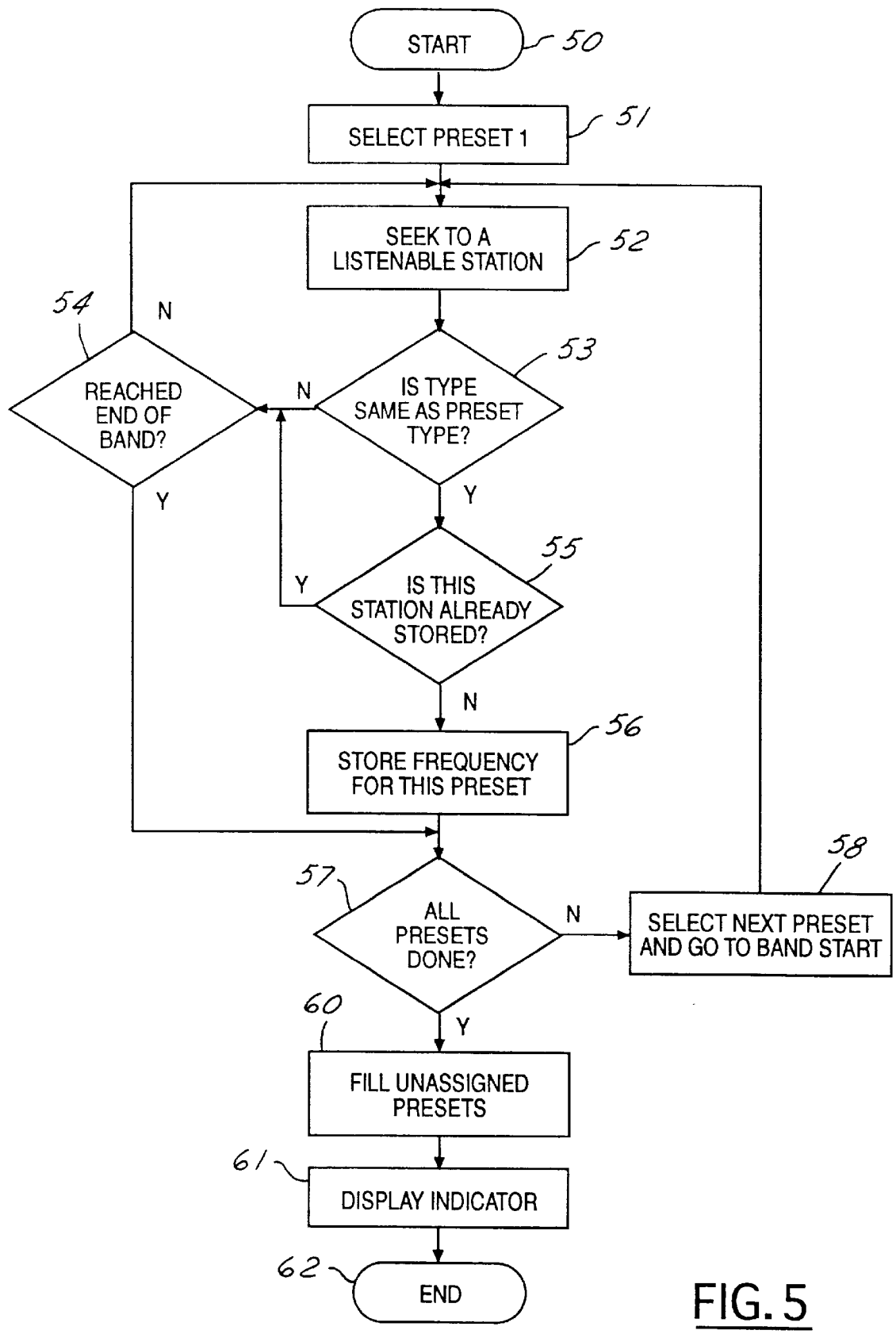
FIG. 5 is a flowchart showing an alternative embodiment of the present invention.

In the method of FIG. 4, the autoset station scan is performed once across the entire band to minimize the time required to complete the autoset function. FIG. 5 shows a method according to an alternative embodiment which may require multiple traversals of the band but which may be conceptually simpler to implement. The process starts in step 50 and the first preset (i.e., preset 1) is selected in step 51. In step 52, a seek to a listenable station is performed. The seek may typically stop at the first listenable station, however, alternative embodiments for searching for the strongest station or using some other listenability criteria can be used. In step 53, a check is made to determine whether the found station is transmitting auxiliary data identifying it as the same content type as the preset being assigned. If the content type does not match, then a check is made in step 54 to determine whether the end of band has been reached. If not, then a seek is performed to the next listenable station in step 52. If the content code of the found station matches the code associated with the current preset, then a check is made in step 55 to determine whether this current station has already been stored in a previous autoset preset. If it has then a check is made in step 54 to determine if the end of band has been reached. If the current station has not already been stored, then it is stored as the autoset frequency for the current preset in step 56. After the current frequency is stored or after the end of band is reached as determined in step 54, a check is made in step 57 to determine whether all presets have been processed. If a preset remains to have an autoset frequency assigned to it, then the next preset is selected in step 58, the tuner is commanded to return to start of band, and then a seek is initiated in step 52 to the first listenable station.

Once all presets have been processed in step 57, a fill of unassigned presets is conducted in step 60 in a conventional manner. In step 61, the radio display indicates that the autoset function has been completed and the process ends in step 62.

The content code transmitted by a broadcast station may not be constant over time. For example, a station may change format throughout the day or a program identification code may change according to certain programming which may be broadcast by the station. In order to keep the normal preset information up to date, normal receiver operation is preferably modified as shown in FIG. 6 to continuously update the stored content type code for the normal links of the presets. This procedure would not be used while the receiver is in the autoset mode with the autoset links active. The updating process begins in step 65 whenever the receiver is re-tuned to a new broadcast station in the normal mode. In step 66, the tuned frequency is checked to determine whether it coincides with a preset frequency (such as when the station is recalled by depressing a preset button). If the frequency is not associated with a preset, then the method is exited in step 67. In step 68, a check is made to determine whether the content type code currently being received is different from the one stored for the preset. If there is no difference, then the method is exited in step 67. If there is a difference, then the new content type code is stored in association with the preset in step 70 and the method ends in step 71.

What is claimed is:

1. A broadcast radio receiver for receiving broadcasts including auxiliary data, wherein said auxiliary data includes a content code identifying which one of a plurality of predetermined content types a respective broadcast station is operating under, said receiver comprising:

preset buttons on said receiver for returning said receiver to a respective broadcast station associated with each respective preset button, said preset buttons selectably operating in either a normal preset mode or an autoset mode, each preset button having a normal link with a respective broadcast station in said normal preset mode which is manually determined by a user, and each preset button having an autoset link with a respective broadcast station in said autoset mode which is automatically assigned by said receiver during an autoset scan;

a normal preset memory storing a respective frequency value and a respective content code for a broadcast station linked with each respective preset button in said normal preset mode; and an autoset memory storing a respective frequency value for a broadcast station linked with a respective preset button in said autoset mode, wherein a broadcast station linked in said autoset mode with at least one respective preset button is determined according to a content code of a broadcast station linked with the same preset button in said normal preset mode.

2. A method for customized tuning of a broadcast radio receiver which receives broadcasts including auxiliary data, wherein said auxiliary data includes a content code identifying which one of a plurality of predetermined content types a respective broadcast station is operating under, said radio receiver including preset buttons and a memory containing links to automatically tune said radio receiver to linked frequencies, said method comprising the steps of:

manually tuning to receive broadcast stations in a first reception area;

programming selected preset buttons to create normal links between said selected preset buttons and desired broadcast stations;

storing a content code received from respective desired broadcast stations as a part of each of said normal links for which said respective desired broadcast stations include a content code in their broadcasts;

initiating an autoset mode while in a second reception area where at least some of said desired broadcast stations are not receivable;

retrieving a content code in a normal link corresponding to a first preset button;

scan tuning said radio receiver to search for a receivable broadcast station which is transmitting said retrieved content code; and creating an autoset link between said first preset button and a receivable broadcast station found to be transmitting said retrieved content code.

3. The method of claim 2 further comprising the steps of:

creating autoset links between other preset buttons for which a receivable broadcast stations are found to be transmitting matching content codes; and creating autoset links between any remaining unassigned preset buttons and receivable broadcast stations without matching content codes.

* * * * *